United States Patent [19]

Scherz et al.

[11] Patent Number: 5,055,775

[45] Date of Patent: Oct. 8, 1991

[54] TRANSMISSION DEVICE

[75] Inventors: Michael Scherz, Dreikönigstr. 1-3, 8520 Erlangen 1; Wilhelm Jahn, Schwarzenbruck; Werner Röschlau, Nuremberg, all of Fed. Rep. of Germany

[73] Assignee: Michael Scherz, Erlangen, Fed. Rep. of Germany

[21] Appl. No.: 496,198

[22] Filed: Mar. 19, 1990

[30] Foreign Application Priority Data

Mar. 18, 1989 [DE] Fed. Rep. of Germany ....... 3908982

[51] Int. Cl.[5] .............................................. G01R 31/00

[52] U.S. Cl. ............................ 324/158 MG; 324/167; 324/173; 310/268; 336/120

[58] Field of Search ............... 324/158 MG, 167, 175; 336/120; 310/268, 176; 318/263, 271

[56] References Cited

U.S. PATENT DOCUMENTS

| | | | |
|---|---|---|---|
| 3,786,354 | 1/1974 | Lasky | 324/173 |
| 4,211,973 | 7/1980 | Sato et al. | 324/158 MG |
| 4,323,364 | 4/1982 | Scherz . | |
| 4,366,405 | 12/1982 | Schmider | 310/268 |
| 4,412,198 | 10/1983 | Reich | 336/120 |
| 4,675,638 | 6/1987 | Szabo | 336/83 |
| 4,689,546 | 8/1987 | Stephens et al. | 310/176 |
| 4,829,401 | 5/1989 | Vranken | 336/120 |
| 4,868,443 | 9/1989 | Rossi | 310/268 |

FOREIGN PATENT DOCUMENTS

| | | |
|---|---|---|
| 0133802 | 3/1985 | European Pat. Off. . |
| 2846583 | 4/1980 | Fed. Rep. of Germany . |

*Primary Examiner*—Kenneth A. Wieder
*Assistant Examiner*—William J. Burns
*Attorney, Agent, or Firm*—Wenderoth, Lind & Ponack

[57] ABSTRACT

An apparatus for tranmitting signals that can be broken down into at least one AC voltage component between a rotor and a stator from a sender unit to a receiver unit, with the help of annular coils, the coil windings of which form components of the sender or receiver unit, and which are arranged coaxially to the axis of rotation of the rotor and inductively coupled is to be developed so as to generate measured values that are associated with the rotational speed. According to the present invention, this is done in that at least one pair (13, 14; 15, 16) of annular coils is provided for supplying voltage to components on the rotor; in that at least one additional pair (17, 18) of annular coils is provided for the transmission of values that are to be measured on the rotor by means of a measuring system, from the rotor to the stator; in that a sensor element (43) for scanning the rotational speed of the rotor is provided; and in that a switching unit (44) is provided, with the help of which the measured values associated with the rotational speed of the rotor can be further processed or displayed (FIG. 3).

5 Claims, 3 Drawing Sheets

TRANSMISSION DEVICE

BACKGROUND OF THE INVENTION

The present invention relates to a system for transmitting signals that can be broken down into at least one AC voltage component, between a rotor and a stator, from a sender unit to a receiver unit, with the help of pairs of annular coils, the coil windings of which form parts of the sender or receiver unit and which are arranged coaxially to the axis of rotation of the rotor and which are inductively coupled.

In many technical areas, for example during the analysis process using an ultra-centrifuge as described in DE-PS 29 43 942, it is necessary to transmit electrical signals, which may be in the form of analog or digital values, from a rotor to a stator after suitable intermediate amplification, when they are then displayed or subjected to further processing. On the other hand, in many instances there is a need to transmit control or switching commands from the stator to the rotor by means of electrical signals.

The use of slip-ring systems is already known; however, such systems are associated with difficulties based on matters of principle when the signals that are to be transmitted involve relatively low voltages, and in particular when high rotational speeds of the rotor are involved. In addition, the various magnetic, electrostatic, and light-scanning systems, already known in electro-accoustic technology, also form part of the prior art. Using these, signals are stored on a moveable carrier, for example, an optical disk, by scanning onto a fixed receiver unit.

Generally speaking, during the transmission of the signal, particular difficulty is encountered if one or a plurality of measurement devices rotate with the rotor, and the measured or output values of these, which can be varied in time, are to be transmitted to a fixed receiver unit.

DE-PS 28 46 583 describes an apparatus for transmitting measuring signals through a transmitter from a rotor to a stator, and for transmitting a supply voltage through the same transmitter from the stator to the rotor. This is effected in that there is a power oscillator with a low output impedence on the stator side so as to generate the supply voltage, this having an essentially higher frequency than the frequency modulated measuring signals, the oscillator being connected to the transmitter through a condenser, and in which between the condenser and the transmission coil, the measuring signals are uncoupled at a point that is of a high resistance during transmission conditions, a rectifier for the supply voltage and a signal generator for the measuring signals being arranged on the rotor side, it being possible to couple the measuring signals in a point between the rectifier and the transmission coil. Such a dual exploitation of the coil elements of the transmitter that are figured as annular coils causes problems that are associated with circuit technology.

Also part of the prior art is an arrangement for measuring the temperature on rotating shafts, which is described in DE-PS 958 600. In this, there are two inductive transmitters in conjunction with a bridge circuit, one branch of which incorporates a resistance thermometer. The bridge receives its supply voltage through the annular coil system of one transmitter, whereas the other annular coil system of another transmitter passes on the measured values to the display instrument.

SUMMARY OF THE INVENTION

It is the task of the present invention to configure an apparatus of the type described in the introduction hereto so that non-contact transmission of measured values and energy can be effected between a rotor and a stator in conjunction with analysis or further processing that is a function of rotational speed. At the same time the present invention is also intended to permit, in particular, the transmission of the signals when the rotors are spinning at high speeds, for example, in excess of 5,000 rpm.

According to the present invention, the solution to this task lies in the fact that at least one pair of annular coils is provided to supply voltage to the components on the rotor; in that at least one additional pair of annular coils is incorporated for transmitting the values that are to be measured on the rotor with a measuring system from the rotor to the stator; in that a sensor element is provided to scan the rotational speed of the rotor; and wherein there is one circuit element, with the help of which the measured values that are associated with the rotational speed of the rotor can be further processed or displayed.

The transmitter or receiver arranged on the rotor or stator, respectively, can be configured in various ways. In general, use is made of rotor or stator plates on which there are electronic components.

If only relatively weak electrical signals that are of low voltage or at a low energy level can be produced on the rotor, it is possible to install a preamplifier on the rotor plate, directly at the point of generation of the signals, for example, in the immediate vicinity of a measuring device, and transmit the amplified signals through the transmitter to the fixed receiver unit.

In particular, the most varied configurations and switching possibilities are possible for the transmitter and the receiver units, depending on the particular problem. Important in each case is the generation of a magnetic flux that is independent of rotational speed and which links the pairs of coils.

The transmission of the signals take place from the rotor to the stator or from the stator to the rotor. It is also possible to transmit signals between parts that are rotating in directions that are relative to each other, using one pair of coils. The transmission can also be effected intermittently, in both directions.

In a further development of the present invention it can be expedient to provide at least one extra pair of coils to transmit switching or control signals, these then initiating switching processes in the components arranged on the rotor.

A useful embodiment of the above described elementary device can be such that the annular coils lie in recesses in a core element, the distance between the two coil elements forming an air gap. Such a configuration is known per se in the case of magnetic storage devices that are described in EP-PS 0 133 802. The core elements can advantageously be configured as annular disk cores that are open on one side towards the gap. The most varied coil core materials, e.g. ferrite, that are known in transmission technology, can be used for the core elements, although the selection of material will essentially depend on the range of frequencies that are to be transmitted.

According to the basic principle that has been described, electrical signals, for example measured values that have been picked up from the rotor, can be transmitted without any problem on suitable pre-amplification from 4 $\mu$V.

In general, signal transmission in the high frequency range above 30 khz appears to be expedient. When this is done, the electrical signals that are to be transmitted can advantageously be transmitted as coding or as modulation of a carrier frequency. As an example, when this is done, measured values serially coded as digital signals can be transmitted on a carrier frequency of approximately 200 kHz to the stator plate through the coupled annular coils with an 8-bit data code, with stop, start, and parity bits.

Frequency identification is effected in the stator plate and conversion of the signals into a standardized computer-readable interface coding can also take place.

An additional improvement can optionally be effected in that screening of electrically conductive material, preferably of highly conductive metallic material such as copper or aluminium, is arranged between two adjacent annular coils on the rotor or the stator. This makes it possible to eliminate any undesirable cross-talk between the individual transmission paths. Such a screening ring can be used to advantage for fine-tuning the frequency of the transmiter or receiver unit by changing the damping, by interposing a balancing potentiometer or the like (mean frequency equalization of the carrier).

By using the features of the present invention, it is possible to create an apparatus for transmitting electrical signals or voltages, which makes it possible to display or analyze the measured values on the rotor in conjunction with the rotational speed of the rotor, even at high rotational speeds and when the signal is changing very rapidly.

BRIEF DESCRIPTION OF THE DRAWINGS

One embodiment of the present invention is shown diagrammatically in the drawings appended hereto, from which other features of the invention can also be seen; these drawings show the following.

DETAILED DESCRIPTION OF THE INVENTION

Figure 1:
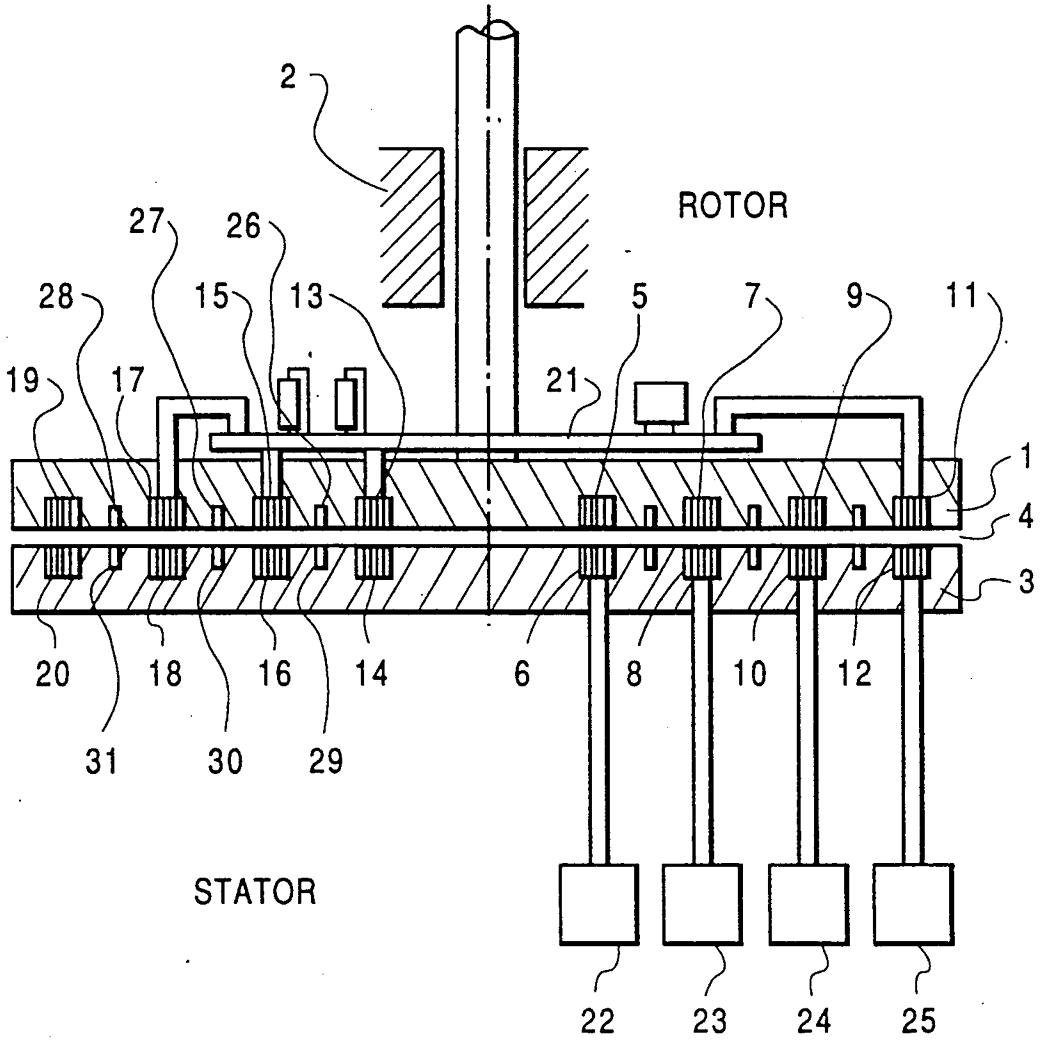
FIG. 1: a longitudinal section through a transmission device.
Figure 2:
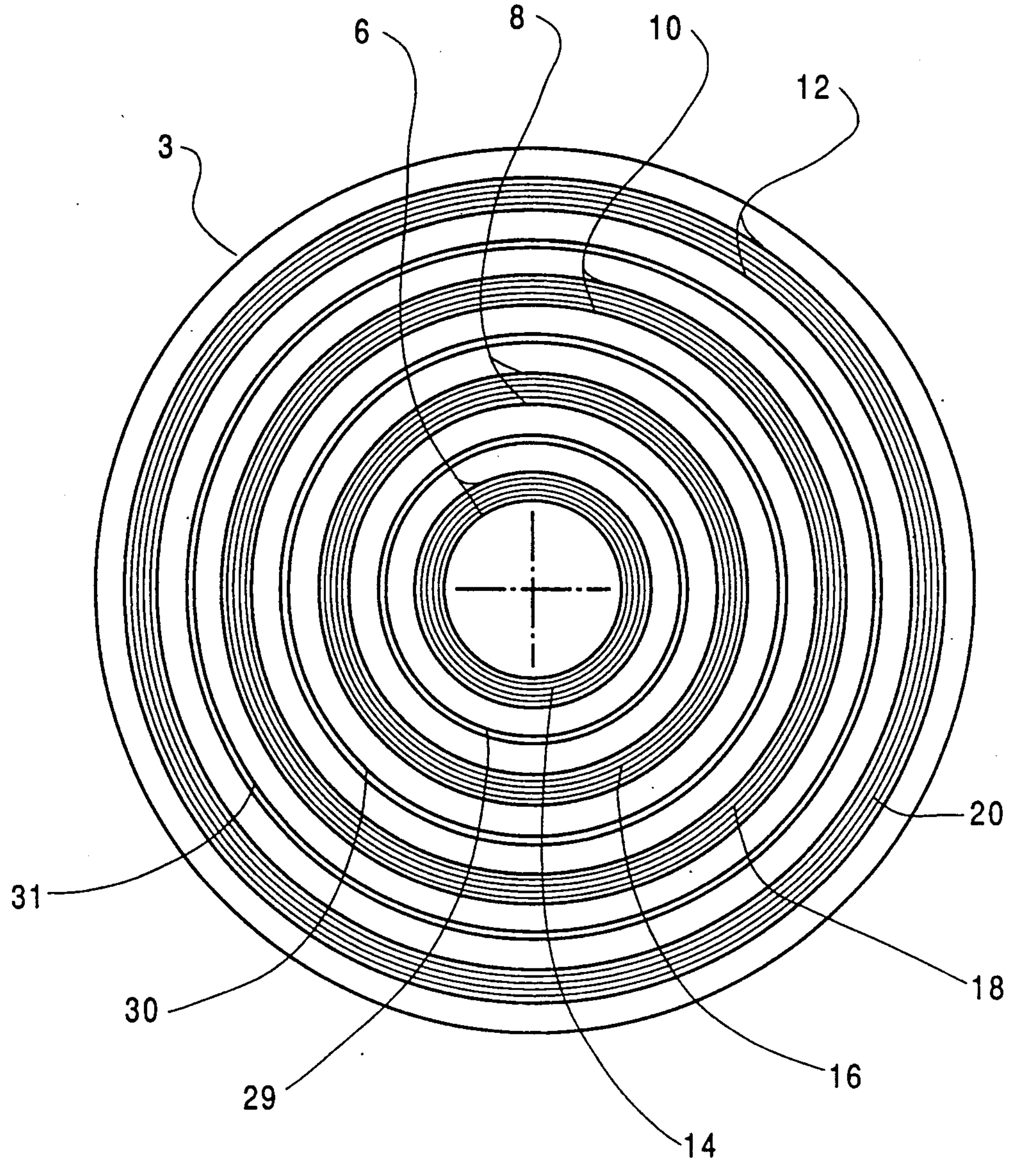
FIG. 2: a plan view of a stator as shown in FIG. 1 configured as an annular disk core that is open on one side.

FIGS. 1 and 2 show a transmission device that transmits electrical signals between a rotor and a stator, and vice versa. The rotor incorporates a core element 1 that is in the form of an annular disk, and this is fitted with a rotating bearing 2 and driven by drive elements that are not shown in the drawing. Arranged coaxially to the rotatable annular disk core element 1 there is an additional fixed core element 3 that is also in the form of an annular disk. The two core elements 1 and 3 are of ferrite. There is an open air gap 4 between the core elements 1 and 3 (a vacuum gap or a liquid-filled gap would also be possible), which is approximately 1 mm wide. Within the two core elements 1, 3 there are annular groove recesses 5, 7, 9, and 11; and 6, 8, 10, and 12, within which there are inductively coupled coaxial annular coils 13, 15, 17, and 19; and 14, 16, 18, and 20.

As is shown, the annular coils 13, 15, 17, and 19 of the rotor are connected to the rotor plate 21 that contains electronic switching or measuring elements.

The annular coils 14, 16, 18, and 20 on the stator are connected with corresponding fixed structural elements 22, 23, 24, 25 for displaying or for processing the signals. These can be any arrangements for digital or analog signal processing and displays which can optionally be combined, at least in part, in a stator plate.

Between the annular coils 13, 15, 17, and 19 of the rotor and 14, 16, 18, and 20 of the stator, there are in each instance screening rings 26, 27, 28; and 29, 30, 31 that are imbedded in the material that forms the core elements 1, 3. These serve as short circuit rings and prevent any undesirable cross-talk between the individual systems.

Figure 3:
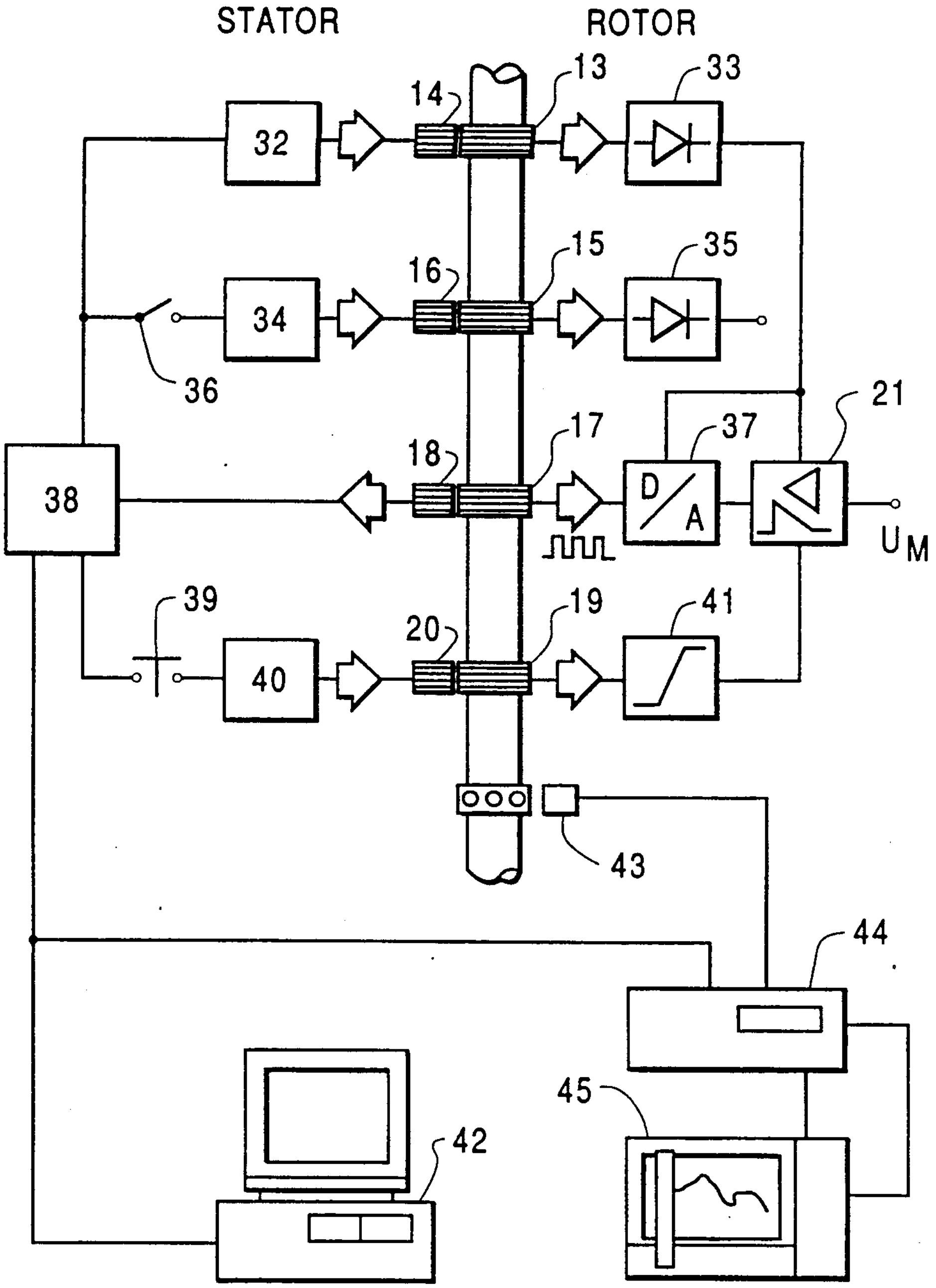
FIG. 3: a circuit diagram of a transmission system using the transmission device shown in FIG. 1.

FIG. 3 shows a circuit diagram for a measuring system. In this, the innermost pair of annular coils 13, 14 serves to transmit voltage from an AC voltage source 32 of the stator to a rectifier unit 33 in the rotor, which supplies the operating voltage for a rotor plate 21.

A further pair of annular coils 15, 16 is provided for transmitting an auxilliary or secondary voltage from an AC voltage source 34, to a rectifier unit 35. This secondary voltage can be switched with the help of a switch 36.

The pair of annular coils 17, 18 is used to transmit the values that are to be measured on the rotor in a measuring system. The measuring voltage $U_M$ that originates from a measuring apparatus is amplified in the rotor plate 21 by means of an amplifier circuit and then digitalized in the analog/digital converter 37. The digitalized signals, optionally modulated onto a carrier frequency, are transmitted through the pair of annular coils 17, 18 to the receiver plate 38.

In order that the appropriate switching processes can be initiated on the rotor plate 21—as an example, switching the degree of amplification of the measurement amplifier to match it to differing measurement ranges can be expedient—there is an additional pair of annular coils 19, 20 to provide for transmission of the switching commands. A push button 39 sends a switching pulse through a pulse apparatus 40 into a switching device 41 on the rotor side, which, for example, changes the degree of amplification of the measurement amplifier on the rotor plate 21 incrementally.

The signals transmitted from the rotor plate 21 are passed from the stator plate 38 for direct computer processing in a computer 42.

A sensor element 43 that is operated by a permanent magnet on the rotor side of the device is provided to monitor the speed of rotation of the rotor; this passes signals corresponding to the rotational speed to a display unit 44. The display unit 44 is connected to the stator plate 38 and permits a graphic representation of the curve of the measurement voltage $U_M$ as a function of the rotor speed by means of a plotter 45.

The apparatus described in the above embodiment was developed especially for carrying out the analysis procedure described in DE-PS 29 43 942.

We claim:

1. An apparatus for transmitting signals that can be broken down into at least one AC-voltage component from a sender to a receiver unit, comprising:

a rotor including a disc-shaped rotor core element rotatable about an axis and having a plurality of annular rotor grooves formed in one face thereof concentrically about said axis;

a plurality of annular rotor coil windings mounted in said plurality of rotor grooves, respectively, said plurality of rotor coil windings being adapted to connect to one of the sender unit and the receiver unit;

a stator including a disc-shaped stator core element mounted adjacent said rotor core element so as to form a gap therebetween, said stator core element having a plurality of annular stator grooves formed concentrically about said axis in one face of said stator core element which is opposed to said one face of said rotor core element;

a plurality of annular stator coil windings mounted in said plurality of stator grooves, respectively, said plurality of stator coil windings being inductively coupled with said plurality of rotor coil windings, respectively, and being adapted to connect to the other of the sender unit and the receiver unit;

a measurement apparatus mounted on said rotor;

a first means, comprising a first pair of coil windings including a first of said rotor coil windings and a first of said stator coil windings which is aligned with said first rotor coil winding, for transmitting supply voltage from said stator to said measurement apparatus;

digitizing means for digitizing signals outputted from said measurement apparatus;

a second means, comprising a second pair of coil windings including a second of said rotor coil windings and a second of said stator coil windings which is aligned with said second rotor coil winding, for transmitting digitized signals from said digitizing means to said stator;

sensor means for sensing a speed of rotation of said rotor and outputting a speed signal; and processing means, operatively connected to said speed sensor and said stator, for further processing or displaying said digitizing signals and said speed signal.

2. An apparatus as defined in claim 1, further comprising a third means, comprising at least a third pair of coil windings including a third of said rotor coil windings and a third of said stator coil windings which is aligned with said third rotor coil winding, for transmitting signals which initiate switching processes in said measurement apparatus.

3. An apparatus as defined in claim 1, further comprising:

at least one annular screening ring mounted on said rotor between at least two of said rotor coil windings, respectively.

4. An apparatus as defined in claim 3, further comprising at least one annular screening ring mounted on said stator between at least two of said stator coil windings, respectively.

5. An apparatus as defined in claim 4, wherein said annular screening rings mounted on both said rotor and said stator are formed of an electrically conductive material.

* * * * *